United States Patent
Sauer

(10) Patent No.: US 7,839,317 B1
(45) Date of Patent: Nov. 23, 2010

(54) FOLDING COMPARATOR COMPATIBLE WITH LEVEL-CROSSING SAMPLING

(76) Inventor: Don Roy Sauer, 1499 Cliff Dr., San Jose, CA (US) 95132

( * ) Notice: Subject to any disclaimer, the term of this patent is extended or adjusted under 35 U.S.C. 154(b) by 16 days.

(21) Appl. No.: 12/502,127

(22) Filed: Jul. 13, 2009

(51) Int. Cl.
  *H03M 1/34* (2006.01)
(52) U.S. Cl. .................. 341/158; 341/156
(58) Field of Classification Search .......... 341/156, 341/158
  See application file for complete search history.

(56) References Cited

U.S. PATENT DOCUMENTS

| | | | |
|---|---|---|---|
| 4,069,460 A | 1/1978 | Sauer | |
| 4,291,299 A | 9/1981 | Hinz et al. | |
| 4,352,999 A | 10/1982 | Galpin | |
| 4,599,602 A * | 7/1986 | Matzuzawa et al. | ......... 341/161 |
| 4,931,797 A | 6/1990 | Kagawa et al. | |
| 5,001,364 A | 3/1991 | Petrie et al. | |
| 5,307,067 A | 4/1994 | Kimura et al. | |
| 5,315,284 A | 5/1994 | Bentley et al. | |
| 5,392,045 A | 2/1995 | Yee | |
| 5,633,638 A | 5/1997 | Venes et al. | |
| 5,640,163 A | 6/1997 | Nauta et al. | |
| 5,719,578 A | 2/1998 | Bohme | |
| 6,020,840 A | 2/2000 | Ong | |
| 6,157,257 A | 12/2000 | Murphy | |
| 6,346,904 B1 * | 2/2002 | Gaillard et al. | ............. 341/155 |
| 6,411,246 B2 | 6/2002 | Nagaraj | |
| 6,480,065 B1 | 11/2002 | Herrera et al. | |
| 6,492,929 B1 | 12/2002 | Coffey et al. | |
| 6,888,482 B1 * | 5/2005 | Hertle | ........................ 341/120 |
| 7,009,547 B2 | 3/2006 | Guo et al. | |
| 7,277,041 B2 | 10/2007 | Scholtens | |
| 2005/0083223 A1 | 4/2005 | Devendorf | |

* cited by examiner

*Primary Examiner*—Khai M Nguyen

(57) ABSTRACT

A Folding Comparator circuit which receives an analog input current and both compares it to a DC reference current while at the same time folding the input current around the reference current to be passed on as an output current which can then be passed on to another folding comparator stage. A series of such stages connected together with some XOR logic gates can perform an analog to digital conversion process as a pipeline of auto-folding stages which will instantly convert analog signal to digital signal.

8 Claims, 6 Drawing Sheets

$I_{abs1} = ABS(I_{in1} - I_{ref1})$ $D_{out1} = Sign(I_{in1} - I_{ref1})$

Folding Comparitor with Diode Coupler

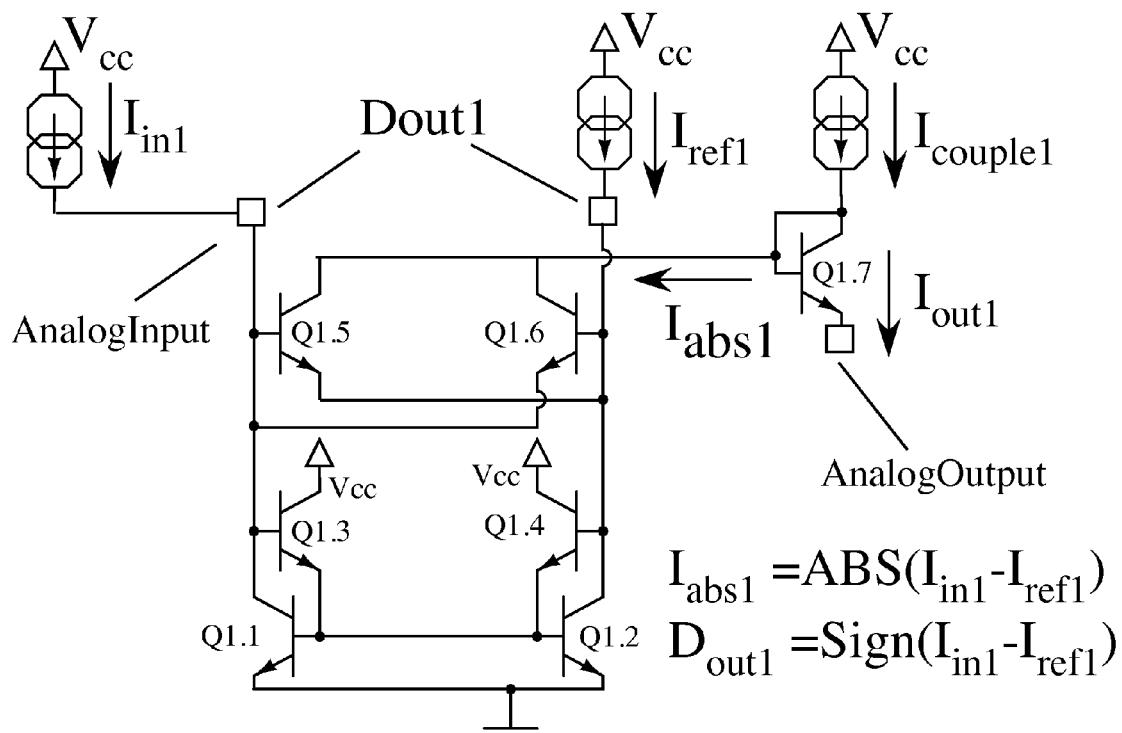
FIG 1 Folding Comparitor with Diode Coupler
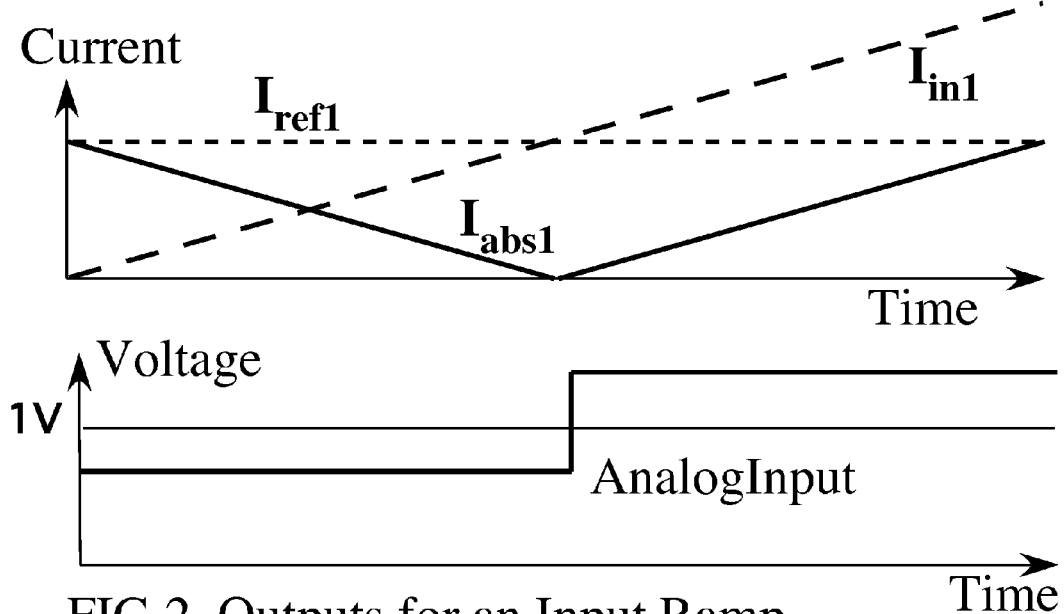
FIG 2 Outputs for an Input Ramp

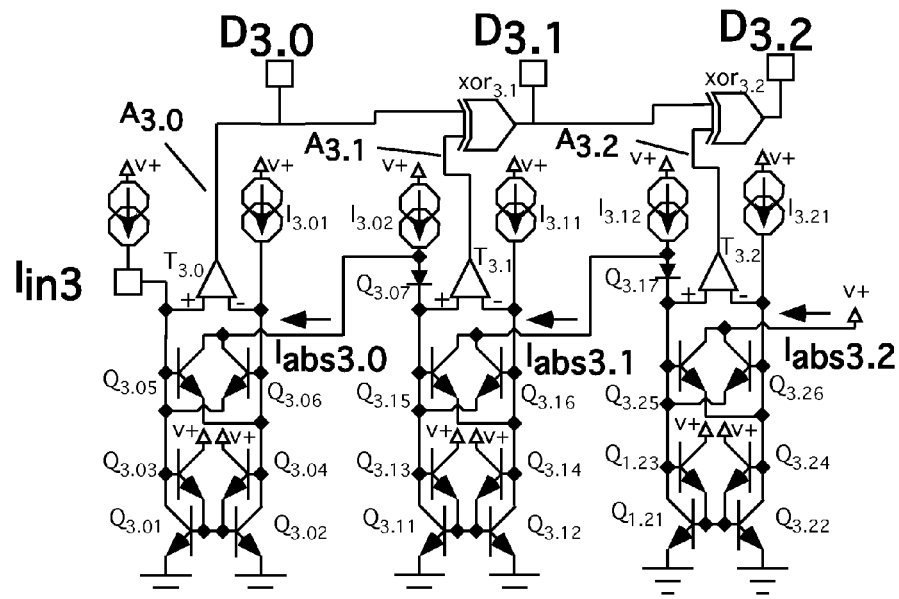
FIG 3  3Bit Level-Crossing Sampling
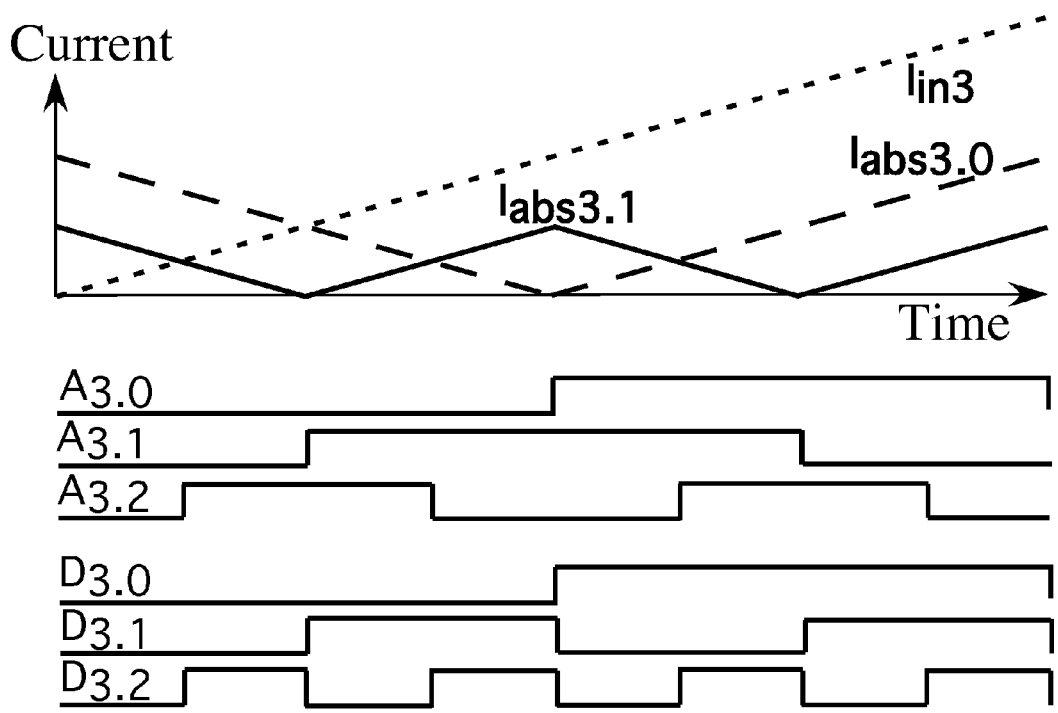
FIG 4  Outputs for an Input Ramp

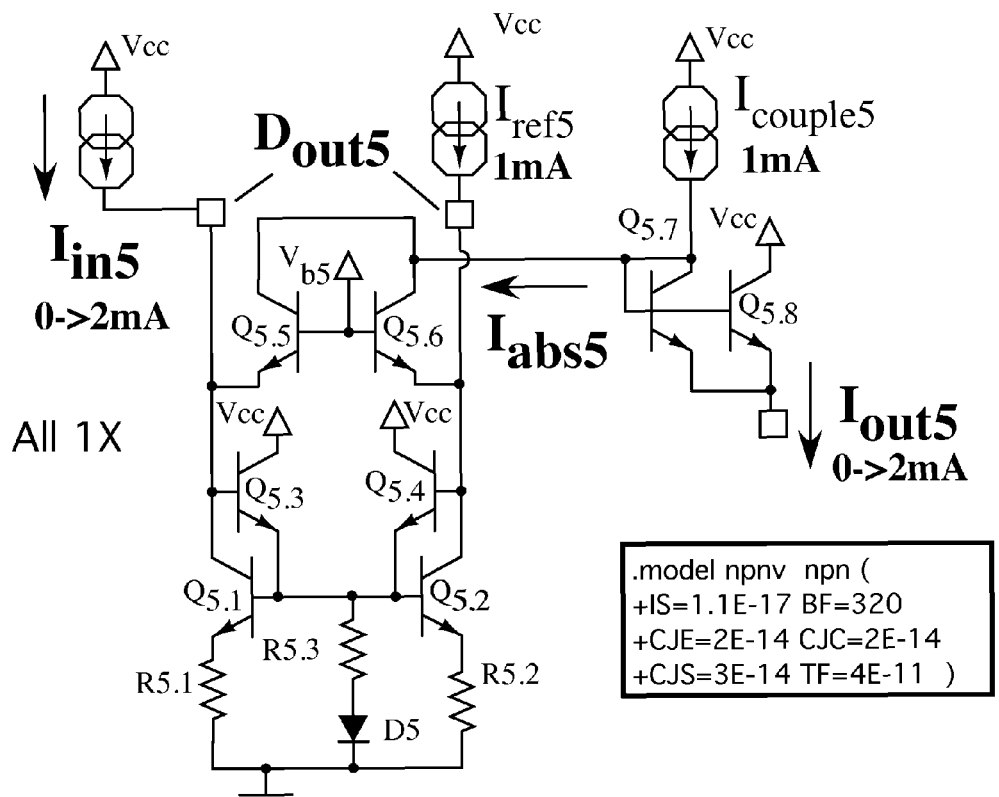
FIG 5 High Speed Embodiment
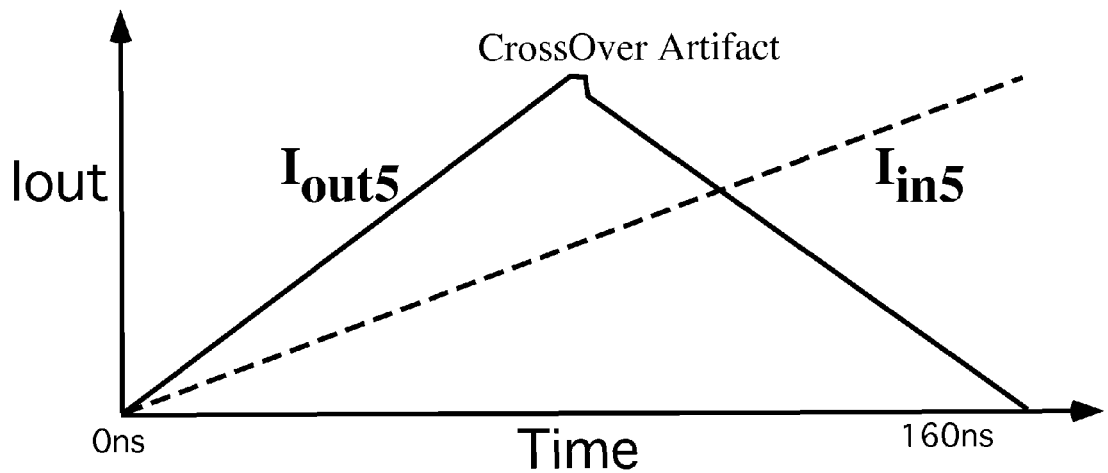
FIG 6 Output current for a 160ns Input Ramp

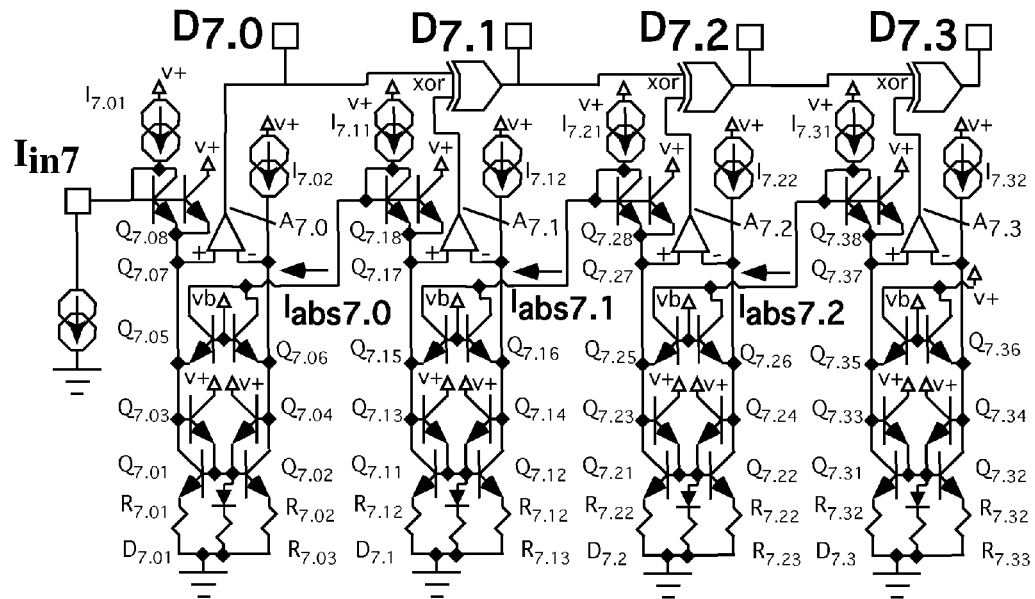
FIG 7  4Bit Level-Crossing Sampling
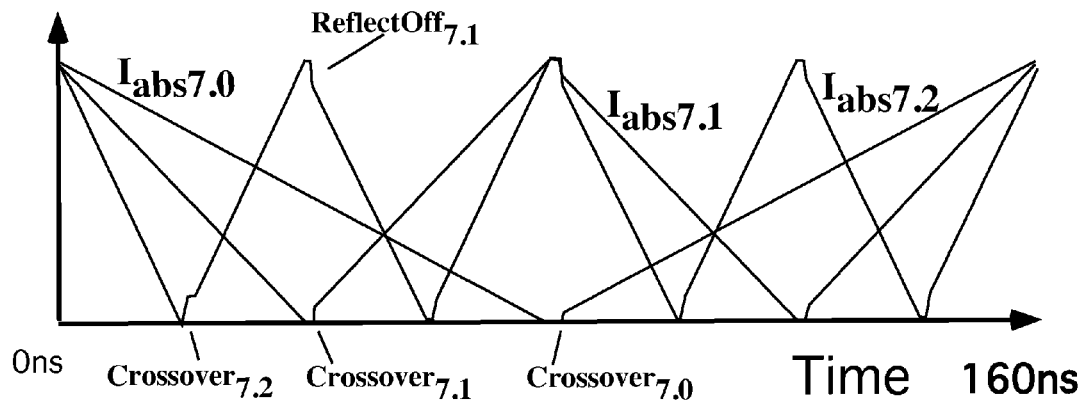
FIG 8  Output Distortions with a 160ns Ramp (Fig7)

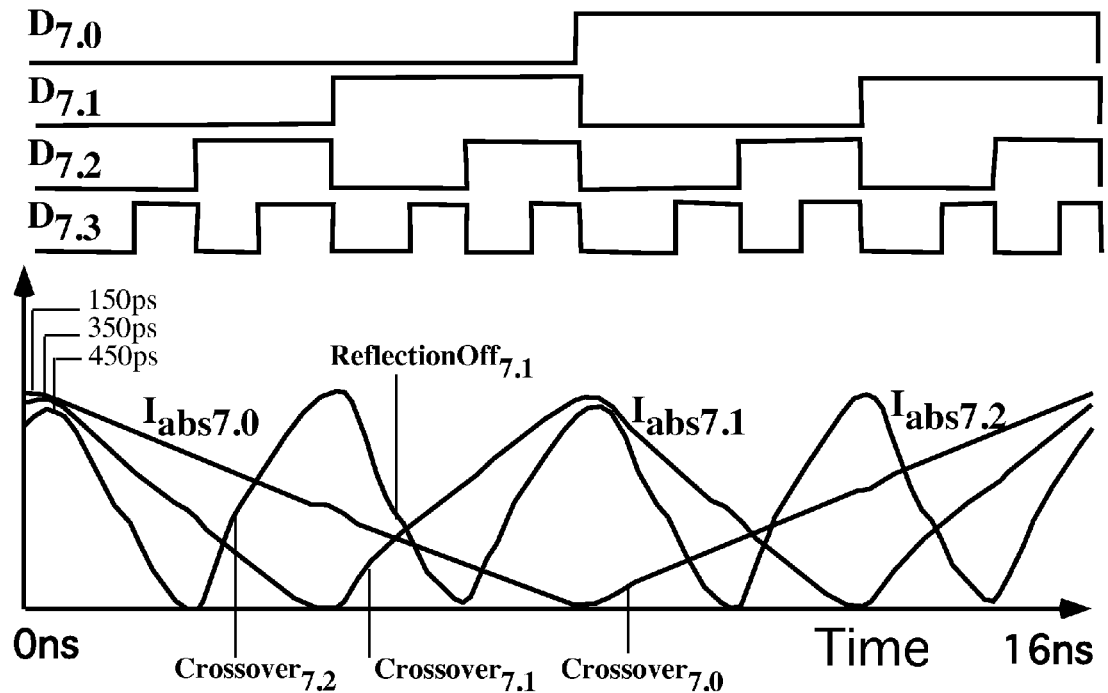
FIG 9  Output Waveforms with a 16ns Ramp (Fig7)
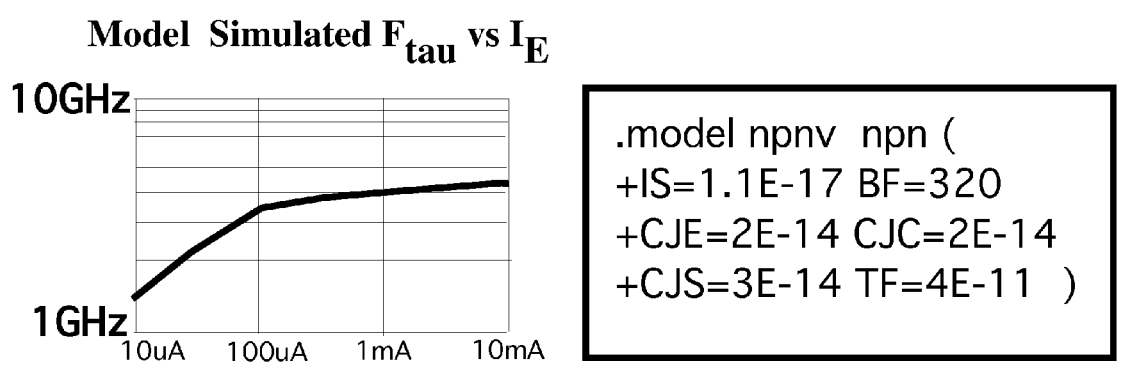
FIG 10  Process Model Used for Simulation

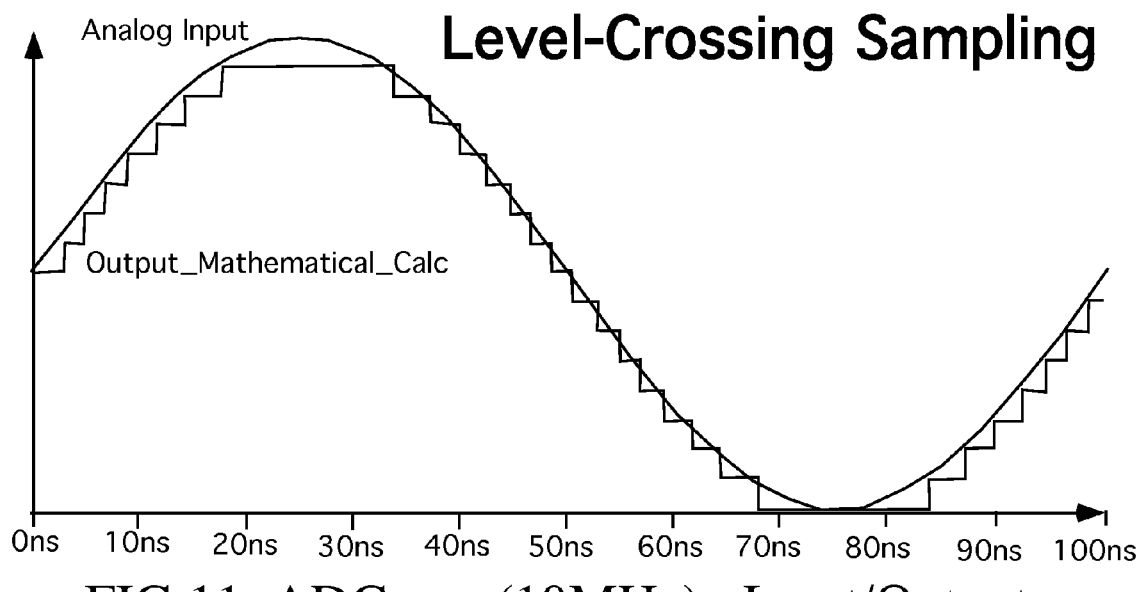
FIG 11 ADC$_{4bits}$(10MHz) Input/Output

FOLDING COMPARATOR COMPATIBLE WITH LEVEL-CROSSING SAMPLING

FIELD OF THE INVENTION

Analog to Digital conversion is normally done at a fixed periodic rate of time commonly referred to as Nyquist sampling. An alternative non-synchronous method of conversion produces a digital output transition at the exact time the analog input crosses a threshold level. In this case the Analog to Digital converter is operating like a fast analog comparator, but which has more than a one digital output. Such a method is called level-crossing sampling or threshold level sampling. Such a method provides additional timing information at the digital outputs as to when the analog input signal crosses a threshold. This invention teaches a simple way to do level-crossing sampling using a series of folding comparators. The folding comparators perform both a folding and signal comparison function in which an input signal is compared to a reference resulting in the generation of both a differential digital output signal and a folded analog output signal which can be passed on to the next stage. The folding comparators can be build using only the fastest transistors available on chip, all of which can be bias up to run at maximum speed, such that conversion speeds will encourage the use of differential logic techniques. An Analog to Digital Convertor built using this architecture will function much like an analog comparator, but it can have more than a single bit output. The resulting Analog to Digital conversion is thus formatted to a pure analog continuous time digital output rather than a digital timing that is periodic. The digital output will self time itself to a continuously varying analog input provided the input signal slew rate is such that the LSB stage is converting at a fraction of the speed of the bandwidth of the fastest on chip transistors.

BACKGROUND

Asynchronous Analog to Digital methods have been patented in many different forms. A flash Analog to Digital Convertor might consist of an array of parallel comparators followed by logic. Some other common techniques being used are pipeline architectures and folding architectures. This invention shows a very simple architecture which can compare and fold an analog signal in a pipeline of stages at a fast enough rate to do the conversion real time. The architecture can do this by using only the fastest transistors available on the chip. The simplicity in the signal path encourages the development of many speed enhancement methods. Applying the simplest speed enhancement methods presently allow a 4 bit Analog to Digital Convertor to follow a continuous time signal, and output every one of the 16 LSB transitions at a 1 GHz rate, while using transistors which only have a bandwidth of 4 GHz.

The fundamental folding comparator circuit is shown in FIG. 1. An almost identical circuit can be found in U.S. Pat. No. 4,069,460. This invention has discovered and exploited some important new surprises over and above the U.S. Pat. No. 4,069,460 circuit.

The first big surprise is the discovery that analog input ports can operate as digital output ports at the same time. A moving analog current is applied to the analog input node on FIG. 1. A second DC reference current is being applied to the other node. These two nodes are also being used as a single differential binary voltage output port. FIG. 2 shows how the analog input of FIG. 1 response to a full scale ramp up signal. This circuit node will toggle from one diode to two diode voltages. Not shown but at the same time the other circuit node of Dout1 is toggling from two diodes to one diode in voltage.

The second surprise is the available simplicity and speed to the analog signal path. The circuit of FIG. 1 is completely self biased by a high speed input analog signal current and a DC reference current. Since a DC reference current is constant, it is not in the signal path. Such a current source can be built using slow transistors. The input signal current only needs to be fast. This input signal current can have a high speed signal path to the output port since it is only handled by transistors contain within the folding comparator stage. Only the fastest transistors available on chip need to be used in the folding comparator's analog signal path.

The third surprise is the fact that the input current is being folded around the DC reference current before being passed on to the output port. An input ramp needs to be applied to see this. FIG. 2 shows that Ioutput1 will be in fact follow Iinput1 automatically folded around the DC level of Iref1. Then Ioutput1 can be coupled to the input of another folding comparator where the analog input signal will get folded again. This folding method is extremely simple compared to the other folding architectures.

The fourth surprise is the ease of current coupling. The circuit in FIG. 3 shows that the coupling of one folding comparator stage to another only requires a diode and another DC current source. Transistor Q1.7 is biased up with another DC current to allow signal current to be applied to the next stage in the same direction. Signal path speed is therefore not compromised because only the fastest on chip transistors need to be put in the signal path. Being able to pipeline the signal from one stage to the next using only the fastest available transistors is uncommon.

A fifth surprise was how easy it was to take a current gain of two. FIG. 5 shows how adding another transistor across the coupling diode will allow each stage to operate at the same peak to peak levels of current. This allows all transistors in the signal path to be biased up at a common optimum speed.

The sixth surprise is the extreme simplicity. The circuit of FIG. 7 is actually showing all the transistors in the signal path that are needed to implement 4 bits of high speed Level-Crossing Sampling. A Flash would require 16 much more complicated voltage comparators and also much more logic to do the same job.

BRIEF SUMMARY OF THE INVENTION

This invention relates to a folding comparators architecture which both compares and folds the input analog signal such that the a series of such circuits can function like a high speed analog comparator which can have more than a one bit digital output in a format which is commonly referred to as a Level-Crossing Sampling method of Analog to Digital Conversion.

BRIEF DESCRIPTION OF THE DRAWINGS

Non-limiting and non-exhaustive embodiments are described with reference to the following drawings:

FIG. 1 illustrates a simple embodiment of the invention showing how the analog signal path flows from AnalogInput to AnalogOutput while getting both compared and folded around a DC reference current.

FIG. 2 illustrates all the current and voltage waveforms of FIG. 1 when the input current Iin1 is ramped up from zero to twice that of DC reference current Iref1.

FIG. 3 illustrates how the circuit of FIG. 1 is connected in three stages together with some simple logic gates to perform a 3 bit Analog to Digital Conversion in a Level-crossing Sampling format.

FIG. 4 illustrates all the analog currents and digital states of FIG. 3 when a input current is ramped up full scale over time.

FIG. 5 illustrates the preferred high speed embodiment of the invention where the differential digital output voltage levels are reduced and a current gain of two is taken at the analog output such that the peak to peak current levels in the analog signal path have a current gain of one.

FIG. 6 illustrates both the analog input current and the analog output of FIG. 5 to the same scale when the input analog current is ramped up full scale over time.

FIG. 7 illustrates how the circuit of FIG. 5 is connected in four stages together with some simple logic gates to perform a high speed 4 bit Analog to Digital Conversion in a Level-crossing Sampling format.

FIG. 8 illustrates the analog output signal currents in the four stages of FIG. 7 when the input current Iin7 is ramped up from zero to full scale in 160 ns.

FIG. 9 illustrates the logic output signals and analog output signal currents in the four stages of FIG. 7 when the input current Iin7 is ramped up from zero to full scale in 16 ns.

FIG. 10 illustrates the Spice models used create the waveforms of FIG. 9 and includes a graph showing the relationship of emitter current to transistor bandwidth.

FIG. 11 illustrates the input signal to and a corresponding output signal from of the circuit of FIG. 7 when a 10 Mhz full scale sine wave signal is applied at the analog input.

DETAILED DESCRIPTION OF THE PREFERRED EMBODIMENT

FIG. 1 shows the simplest embodiment of the folding comparator. Matched transistors Q1.1 and Q1.2 are both sharing common bases and common emitters, and are intended to have matching collector currents. Transistors Q1.3 and Q1.4 are designed to self bias up Q1.1 and Q1.2 to the larger of the applied input currents Iin1 or Iref1. If Iin1 is less than Iref1, then Q1.4 will turn on Q1.2 until both Q1.1 and Q1.2 are drawing Iref1. Since Iin1 will be less than the collector current of Q1.1, the collector voltage of Q1.1 will drop. Transistor Q1.5 and Q1.6 are intended as voltage clamps. The collector of Q1.1 will drop until transistor Q1.6 makes up the difference in current. Since the circuit is symmetrical, the current at the output which is Iabs1 will be the absolute difference between Iin1 and Iref1. The collectors nodes of Q1.1 and Q1.2 are labeled Dout1 because these two nodes are both functioning as analog input ports and also as a differential output port which toggles between voltage levels of one to two diode voltages as shown in FIG. 2.

Transistor Q1.7 is being used to couple the output current of Q1.5 and Q1.6 to a following stage. The next stage needs current flowing in the opposite direction of Iabs1. By adding a DC current source Icouple1 equal to Iref1, the current subtraction can change the current direction. Diode Q1.7 raises the collector voltages of Q1.5 and Q1.6 to keep the collectors out of saturation. A default voltage clamping circuit which would normally also appear at the base of Q1.7 is not shown only for simplicity sake. This current coupling stage consisting of Q1.7 and Icouple1 is all that is needed in Spice to couple one stage to the next.

FIG. 2 shows that when an input ramp current is applied to Iin1, the output current Iabs1 will in fact auto-fold around the DC current level of Iref1. So the folding comparator of FIG. 1 is both comparing and folding the analog input signal current.

FIG. 3 shows a complete schematic of the folding comparator used in a 3 bit level-crossing sampling application. The full analog signal path is shown in FIG. 3 and it can be spice simulated as such. The digital signal path is displayed using some functional blocks only for simplicity sake. Translation blocks T3.0, T3.1 and T3.1 translate the differential output logic into single ended logic for gates Xor3.1 and Xor3.2. For speed purposes, differential logic may be preferable for the digital signal path.

FIG. 4 shows all signal waveforms when a ramp up current is applied to Iin3. It is interesting to note that all analog signal is in current format while the digital signal is in voltage format. If Iin3 is meant to go from 0 to 1 mA, then reference current I3.02 should be set at 0.5 mA and the output current Iabs3.0 will start off at 0.5 mA, it will drop down to zero, then come back up.

The current coupling to the next stage only requires the DC current source I3.11 and diode D3.1. If DC reference current I3.11 is set to 0.5 mA, then the current in diode D3.1 starts off at zero current, rises to 0.5 mA, then comes back down. So DC reference current I3.2 should be set at 0.25 mA and the output current Iout3.1 will be a folded version of Iabs3.0.

Nodes A3.0, A3.1, and A3.2 are the differential output voltages being expressed in single ended logic format. The folding of the analog signal does require an XOR gate to handle the polarity shift. However FIG. 4 shows that when the output node D3.0 is toggling one input of gate Xor3.1, the other input of Xor3.1 is remaining stationary. In other words there is no race condition. The same principle applies to gate Xor3.2. If the input is not running at speeds too close to the bandwidth of the transistors, then the 3 bit outputs will appear to change instantaneously as would be expected of a comparator. The delays of the comparison action and the XOR gate action will be small enough to not interfere with each other FIG. 5 shows the preferred high speed embodiment of the folding comparator. The main advantage to differential logic is that swinging circuit nodes by several volts requires time. There is always capacitance on any node and there is never an infinite amount of current available to instantaneously slew the node. Differential logic only needs to see circuit nodes toggle two tenths of a volt to detect a one from a zero. By connecting the clamp transistors Q5.15 and Q5.6 to a common voltage source Vb5 to a value around three diode voltages, it is possible to clamp the voltage swing at the collectors of Q5.1 and Q5.2 to toggle close to the two tenths of a volt level.

Transistors Q5.3 and Q5.4 are now being biased up with currents from diode D5 and resistor R5.3 set is 8 Kohm. The model that can be for the simulation is shown in FIG. 10 and has an ftau of 4 Ghz at a 1 mA emitter current. Running at lower currents causes the emitter base capacitance to dominate the speed of a transistor.

Transistors Q5.7 and Q5.8 show that if another matched transistor is connected across the coupling diode, it is easy to take a current gain of two. Having input current and output currents to each folding stage both of the same magnitude and in the same direction makes it easy to use all the stages biased up to the same optimum emitter current for the sake of speed. Any desired gain can be taken based on the ratio of transistors sizes. The base of Q5.7 is assumed to also have default voltage clamp which is left out only for the sake of simplicity. The 200 Ohm resistors R5.1 and R5.2 have also been added mainly to verify any effects they may have on speed. Such matching resistors can improve the match of transistors by almost two orders of magnitude.

FIG. 6 shows how the bandwidth of the transistors begins to affect the high speed performance. When a 160 ns full scale ramp up current is applied to FIG. 5, the limited slew rate on the collector nodes of Q5.1 and Q5.2 begin to show up. When the signal current and a reference current are at an equal value, the comparator is toggling its output voltage. This is the point where Iabs5 is zero. Current Iout5 will have a gain of two and a phase reversal. The delay on the Iout5 current is effectively a crossover glitch. When the two output nodes are toggling in voltage, transistors which are off will need some time to turn on. Transistor Q5.3, Q5.4, Q5.5 and Q5.6 are all subject to this problem. Raising the voltage on Vbias5 to around three diodes will reduce this problem to a limited extent. Other techniques can give some transistors a little early warning and are often useful as well.

The current gain of two between stages allows all transistors to run at their optimum speed at 1 mA. FIG. 7 shows the complete circuit which can be used for simulating the full analog signal path. Except for the input signal Iinput7, all the other currents are at 1 mA and DC, therefore they could be built using slow transistors. All the transistors in FIG. 7 are 1X. The same 160 ns full scale input ramp up current is again applied.

FIG. 8 shows all the analog output currents of FIG. 7. Because of the current gain of two, each output current is toggling from zero to 1 mA. Because of the current folding, each following stage is now slewing current twice as fast. Slewing currents is still much better than slewing voltages. The crossover problem appears to double for each stage as expected. For instance Crossover7.1 is about twice the size of Crossover7.0. But output current Iout7.1 is taking a current gain of two. So Crossover7.1 will appear in Iout7.2 at double the size as ReflectOff7.1. And Crossover7.2 will also be twice the size of Crossover7.1. So the crossover artifacts appear to want to appear symmetrical at the edges of all the output currents waveforms. And their magnitude tends to correlate to the current slew rate of an output current. With a 160 ns ramp up current, the crossover distortion glitches create little trouble in the digital outputs since all the current comparisons are taking place at the center of a folded signal.

To see where things are getting into trouble, a 32 ns triangle wave is applied to circuit FIG. 7 while using transistors modeled to have a 4 GHz bandwidth. FIG. 8 shows a portion of the triangle waveforms when the input is ramping up from zero to full scale in 16 ns. Now Crossover7.2 and RefectionOff7.1 are both large enough that they are messing up the comparison process. The Digital outputs are shown above. At this speed, the 4 bit series of comparators is acting like a 4 bit Analog to Digital Convertor which is recording all 16 LSB transitions during a 16 nsec period. So the digital output is changing at a one LSB step per 1 ns rate which is at a 1 GHz conversion rate. This is the conversion speed using 4 GHz transistors.

The model used for FIG. 7 and FIG. 9 are also shown in FIG. 10 at the right. The ftau curve for the model is shown to the left. At 1 mA, ftau (which corresponds to a beta of one) is at 4 GHz. The maximum conversion rate for the simulation using this simplified model is just shy of 2 GHz. Some look ahead techniques could push the conversion rate much closer to 4 GHz. The upper left corner numbers in FIG. 8 shows that each analog coutput signal is adding about a 150 ps delay. The differential logic should be expected to have delays around this range since both the folding comparator and differential logic will be built using the fastest available on chip transistors.

Being a completely new architecture, mismatch should be expected to map to slightly different errors compared to other architectures. Different processes will have different speeds and transistor parameters, which should encourage different high speed techniques to be used for different processes. The folding comparator can be built using any type of transistor. The folding comparator only needs DC current sources for references and current coupling, therefore only the fastest transistors need to be used in the signal path.

FIG. 11 shows how a 10 MHz sine wave undergoes level-crossing sampling. A 10 MHz full-scale sine wave is simulated as being applied to the circuit of FIG. 7 and the digital outputs are then mathematically added up with the proper binary weight to create a mathematical output waveform in shown in FIG. 11. The analog input and mathematical output waveforms are then viewed on the same curve. The output waveform looks like a normal analog to digital conversion. The fact that the time points all have analog resolution is somewhat visible. The delays and other errors are also visible. The total time delay is getting around the 500 ps range.

The level-crossing sampling implies that the digital output should always be able to follow a moving analog input such that every LSB step is outputted precisely when its LSB threshold has been crossed. As long is the fastest transistors on chip are somewhat faster than the input signal, it looks like this is what will happen. This implies that at each transition, the digital output either goes up or down one LSB. The timing of each transition however has full analog resolution. This implies that the data points could be stored as a one bit of direction and as multiple bits of resolution for timing. Improvements to timing accuracy in the folding comparator stages will therefore be adding resolution to the level-crossing sampling data.

While the invention has been shown in this particular embodiment, it will be understood by those skilled in the art that the applications of Folding Comparator architecture are not limited to the ones having been shown. CMOS devices can be substituted for bipolar devices. All of these substitutions can all be made with out departing from the spirit and scope of the invention.

What is claimed is:

1. A folding comparator circuit comprising:
    an analog input signal current port and a dc reference current port and an analog output signal current port and an analog input signal current which is applied to the said analog input signal current port and a dc reference current which is applied to the said dc reference current port; and
    the said analog input signal current port and the said dc reference current port together also constitute a differential digital voltage output port; and
    a matched transistor pair consisting of a first type one and a second type one having collector of said first type one connected to the said analog input signal current port and having collector of said second type one connected to the said dc reference current port and having base of said first type one connected to base of said second type one and having emitters of said first type one and said second type one coupled through matched resistive paths to a signal ground potential; and
    a second transistor pair consisting of a third type one and a fourth type one having emitter of said third type one connected to emitter of said fourth type one together with the common bases of said first type one and said second type one and having collectors of said third type one and said fourth type one connected to an appropriate supply voltage and having base of said third type one coupled to the said analog input signal current port and having base of said fourth type one coupled to the said dc reference current port; whereby both said first type one and said second type one become self biased to have matched collector currents equal to the greater of the said analog input signal current or the said dc reference current; and a third transistor pair consisting of a fifth type one and a sixth type one having emitter of said fifth type one connected to the said dc reference current port and having emitter of said sixth type one connected to the said analog input signal current port and having both collectors of said fifth type one and said sixth type one coupled to said analog output signal current port and having base of said fifth type one connected to an appropriate circuit node and having base of said fifth type one connected to an optionally different appropriate circuit node; whereby the emitters of the said fifth type one or the said sixth type one will limit the voltage swing at the said differential digital voltage output port by coupling emitter currents to the connected collectors of said fifth type one and said sixth type one which couples to the said analog output signal current port a current of a value proportional to the said analog input signal current folded around the said dc reference current.

2. A folding comparator circuit of claim 1, wherein
all transistors can correspond to CMOS transistors having sources, gates, and drains correspond to emitter, bases, and collectors respectively.

3. A folding comparator circuit compatible with a serial level-crossing sampling architecture comprising:

an analog input signal current port and a dc reference current port and an analog output signal current port and an analog input signal current which is applied to the said analog input signal current port and a dc reference current which is applied to the said dc reference current port; and the said analog input signal current port and the said dc reference current port together also constitute a differential digital voltage output port; and a matched transistor pair consisting of a first type one and a second type one having collector of said first type one connected to the said analog input signal current port and having collector of said second type one connected to the said dc reference current port and having base of said first type one connected to base of said second type one and having emitters of said first type one and said second type one coupled through matched resistive paths to a signal ground potential; and a second transistor pair consisting of a third type one and a fourth type one having emitter of said third type one connected to emitter of said fourth type one together with the common bases of said first type one and said second type one and having collectors of said third type one and said fourth type one connected to an appropriate supply voltage and having base of said third type one coupled to the said analog input signal current port and having base of said fourth type one coupled to the said dc reference current port; whereby both said first type one and said second type one become self biased to have matched collector currents equal to the greater of the said analog input signal current or the said dc reference current; and a third transistor pair consisting of a fifth type one and a sixth type one having emitter of said fifth type one connected to the said dc reference current port and having emitter of said sixth type one connected to the said analog input signal current port and having both collectors of said fifth type one and said sixth type one connected together and having base of said fifth type one connected to an appropriate circuit node and having base of said fifth type one connected to an optionally different appropriate circuit node; whereby the emitters of the said fifth type one or the said sixth type one will limit the voltage swing at the said differential digital voltage output port by coupling emitter currents to the connected collectors of said fifth type one and said sixth type one to a dc coupling current source which is matched proportionally to the current value of the said dc reference current and which is also connected to the collector and base of seventh type one and which couples an emitter current of the said seventh type one to the said analog output signal current port; whereby the said emitter current at the said analog output signal current port couples an output current value proportional to the said analog input signal current folded around the said dc reference current.

4. A folding comparator circuit of claim 3, wherein
a matched eighth type one transistor shares a common base and a common emitter connection with the said seventh type one and collector of the said eighth type one is connected to a supply node.

5. A folding comparator circuit of claim 3, wherein
all transistors can correspond to CMOS transistors having sources, gates, and drains correspond to emitter, bases, and collectors respectively.

6. An analog to digital convertor serial level-crossing sampling architecture comprising:

a plurality of folding comparators circuits in which each stage has an analog input and an analog input signal current port and a dc reference current port and an analog output signal current port and an analog input signal current which is applied to the said analog input signal current port and a dc reference current which is applied to the said dc reference current port; and the said analog input signal current port and the said dc reference current port together also constitute a differential digital voltage output port; and a matched transistor pair consisting of a first type one and a second type one having collector of said first type one connected to the said analog input signal current port and having collector of said second type one connected to the said dc reference current port and having base of said first type one connected to base of said second type one and having emitters of said first type one and said second type one coupled through matched resistive paths to a signal ground potential; and a second transistor pair consisting of a third type one and a fourth type one having emitter of said third type one connected to emitter of said fourth type one together with the common bases of said first type one and said second type one and having collectors of said third type one and said fourth type one connected to an appropriate supply voltage and having base of said third type one coupled to the said analog input signal current port and having base of said fourth type one coupled to the said dc reference current port; whereby both said first type one and said second type one become self biased to have matched collector currents equal to the greater of the said analog input signal current or the said dc reference current; and a third transistor pair consisting of a fifth type one and a sixth type one having emitter of said fifth type one connected to the said dc reference current port and having emitter of said sixth type one connected to the said analog input signal current port and having both collectors of said fifth type one and said sixth type one connected together and having base of said fifth type one connected to an appropriate circuit node and having base of said fifth type one connected to an optionally different appropriate circuit node; whereby the emitters of the said fifth type one or the said sixth type one will limit the voltage swing at the said differential digital voltage output port by coupling emitter currents to the connected collectors of said fifth type one and said sixth type one to a dc coupling current source which is matched proportionally to the current value of the said dc reference current and which is also connected to the collector and base of seventh type one and which connects an emitter current of the said seventh type one to the said analog output signal current port; whereby the said emitter current at the said analog output signal current port couples an output current value proportional to the said analog input signal current folded around the said dc reference current; and a varying signal current is coupled into a first stage folding comparator circuit as the said analog input signal current and the said differential digital voltage output port is coupled out as a bit stage digital output for the said first stage comparator circuit; and all following said folding comparator circuits have their said analog input signal current coupled from the analog output signal current port from a previous said folding comparator circuit; and all following said differential digital voltage output ports are coupled into an exclusive or gate together with the said bit stage digital outputs from a previous said folding comparator circuit to output all other following said bit stage digital outputs.

7. An analog to digital convertor architecture of claim 6, wherein a matched eighth type one transistor shares a common base and a common emitter connection with the said seventh type one and collector of the said eighth type one is connected to a supply node.

8. An analog to digital convertor architecture of claim 6, wherein all transistors can correspond to CMOS transistors having sources, gates, and drains correspond to emitter, bases, and collectors respectively.

* * * * *